United States Patent
Ku et al.

(10) Patent No.: US 8,441,831 B2
(45) Date of Patent: May 14, 2013

(54) SEMICONDUCTOR INTEGRATED CIRCUIT HAVING STACKED SEMICONDUCTOR CHIPS AND VIAS THEREBETWEEN

(75) Inventors: Young-Jun Ku, Gyeonggi-do (KR); Tae-Sik Yun, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 161 days.

(21) Appl. No.: 12/878,347

(22) Filed: Sep. 9, 2010

(65) Prior Publication Data

US 2012/0007250 A1 Jan. 12, 2012

(30) Foreign Application Priority Data

Jul. 6, 2010 (KR) .................. 10-2010-0064940

(51) Int. Cl.
*G11C 5/06* (2006.01)
(52) U.S. Cl.
USPC ............................................ 365/63; 365/51
(58) Field of Classification Search ............ 365/51 X, 365/63 O, 51, 63; 257/774, E23.145
See application file for complete search history.

(56) References Cited

U.S. PATENT DOCUMENTS

2008/0128883 A1 6/2008 Lee
2012/0017065 A1* 1/2012 Muralimanohar ............ 711/213

FOREIGN PATENT DOCUMENTS

| KR | 1020090034570 | 4/2009 |
| KR | 1020090048084 | 5/2009 |
| KR | 1020110012405 | 2/2011 |

OTHER PUBLICATIONS

Notice of Allowance issued by the Korean Intellectual Property Office on Apr. 13, 2012.

* cited by examiner

*Primary Examiner* — VanThu Nguyen
(74) *Attorney, Agent, or Firm* — IP & T Group LLP

(57) ABSTRACT

A semiconductor integrated circuit includes a first semiconductor chip including a first output circuit which is enabled in a first operation mode and outputs a first output signal and a second output circuit which is enabled in a second operation mode and outputs a second output signal; a second semiconductor chip including a first input circuit which is enabled in the first operation mode and receives the first output signal and a second input circuit which is enabled in the second operation mode and receives the second output signal; and a common through chip via arranged to vertically penetrate through the semiconductor chip, be coupled with the first and second output circuits in one end and coupled with the first and second input circuits in the other end, and interface transfer of the first and second output signals which are enabled in different operation modes, including the first and second operation modes.

16 Claims, 4 Drawing Sheets

SEMICONDUCTOR INTEGRATED CIRCUIT HAVING STACKED SEMICONDUCTOR CHIPS AND VIAS THEREBETWEEN

CROSS-REFERENCE TO RELATED APPLICATIONS

The present application claims priority of Korean Patent Application No. 10-2010-0064940, filed on Jul. 6, 2010, which is incorporated herein by reference in its entirety.

BACKGROUND OF THE INVENTION

Exemplary embodiments of the present invention relate to semiconductor designing technology, and more particularly, to a semiconductor integrated circuit.

In general, packaging technology for a semiconductor integrated circuit has made a continuous progress to decrease size and increase mount reliability. To obtain high performance despite miniaturization of electrical/electronic devices, technologies for stack package have been developed.

In the semiconductor industry, "stack" means piling up at least two semiconductor chips or packages vertically. When the stack package is applied to a semiconductor memory device, the semiconductor memory device may have more than twice as much memory capacity as the memory capacity that may be realized through a typical semiconductor integrated circuit fabrication process. Also, since the stack package is advantageous in terms of increasing mount density and efficiency in using a mount area as well as increasing the memory capacity, the stack package technologies are drawing attention.

Stack package may be fabricated through a method of stacking individual semiconductor chips and then packaging the stacked semiconductor chips at once or a method of stacking packaged individual semiconductor chips. The individual semiconductor chips of the stack package may be electrically connected through metal wire or a through chip via. Here, a stack package using a through chip via has a structure where a through chip via is formed within semiconductor chips and the semiconductor chips are physically and electrically connected to each other vertically through the through chip via. Here, the through chip via may be a through silicon via (TSV).

FIG. 1 illustrates a typical through chip via.

Referring to FIG. 1, a semiconductor chip C for a stack is formed by forming a via in a semiconductor chip A and forming a through chip via B by filling the via with metal. A semiconductor integrated circuit is formed by stacking a plurality of such semiconductor chips C. The fabricated semiconductor integrated circuit is typically referred to as a three-dimensional (3D) stack package semiconductor integrated circuit.

FIG. 2 illustrates a conceptual diagram of a typical semiconductor integrated circuit.

In the specification, the technology of the present invention is described by taking an example of two semiconductor chips having two through chip vias stacked one on the other is described.

Referring to FIG. 2, a semiconductor integrated circuit 100 includes first and second semiconductor chips 110 and 120 stacked vertically, and first and second through chip vias 130 and 140 which penetrate through the first semiconductor chip 110 and transfer first and second control signals SIGNAL_TSV1 and SIGNAL_TSV2 outputted from the first semiconductor chip 110 to the second semiconductor chip 120. Here, the second semiconductor chip 120 may not have any through chip via. This is because, when diverse circuits are formed on the surfaces of the upper portions of the first and second semiconductor chips 110 and 120, the second semiconductor chip 120 may receive diverse signals outputted from the first semiconductor chip 110 through a pad formed on the surface. When more than three semiconductor chips are stacked, the lowermost semiconductor chip may not have such a through chip via.

Meanwhile, the first semiconductor chip 110 overlying the second semiconductor chip 120 is often referred to as a master chip. The master chip buffers an external signal applied from the outside, e.g., a controller, and controls the second semiconductor chip 120 through the first and second through chip vias 130 and 140. The second semiconductor chip 120 controlled by the master chip is often referred to as a slave chip.

The master chip 110 includes first and second output circuits 112 and 114 for outputting first and second control signals SIGNAL_TSV1 and SIGNAL_TSV2 for controlling the slave chip 120. Here, the first and second output circuits 112 and 114 are disposed on the upper surface of the master chip 110.

The slave chip 120 includes first and second input circuits 122 and 124 for receiving the first and second control signals SIGNAL_TSV1 and SIGNAL_TSV2. Here, the first and second input circuits 122 and 124 are disposed on a surface of the slave chip 120.

One end of the first through chip via 130 is coupled with the first output circuit 112 and the other end of the first through chip via 130 is coupled with the first input circuit 122. The first through chip via 130 interfaces the transfer of the first control signal SIGNAL_TSV1 outputted from the first output circuit 112 to the first input circuit 122. One end of the second through chip via 140 is coupled with the second output circuit 114 and the other end of the second through chip via 140 is coupled with the second input circuit 124. The second through chip via 140 interfaces the transfer of the second control signal SIGNAL_TSV2 outputted from the second output circuit 114 to the second input circuit 124. In FIG. 2, a semiconductor integrated circuit is shown to have the first and second through chip vias 130 and 140. However, a semiconductor integrated circuit in FIG. 2 may include hundreds or thousands of through chip vias.

In the semiconductor integrated circuit 100 having the above-described structure, the master chip 110 and the slave chip 120 exchange the first and second control signals SIGNAL_TSV1 and SIGNAL_TSV2 through the first and second through chip vias 130 and 140. With such a configuration, the semiconductor integrated circuit 100 may reduce current consumption and signal delay.

However, the conventional semiconductor integrated circuit 100 raises the following concerns.

The first and second through chip vias 130 and 140 serve as interface through which the first and second control signals SIGNAL_TSV1 and SIGNAL_TSV2 are transferred between the master chip 110 and the slave chip 120. Here, each of the first through chip via 130 and the second through chip via 140 serves as the interface for one signal, that is, either the first control signal SIGNAL_TSV1 or the second control signal SIGNAL_TSV2. Therefore, if there are many signals to be interfaced between the master chip 110 and the slave chip 120, the number of through chip vias is increased according to the number of signals to be interfaced. This increases the overall size of the semiconductor integrated circuit 100. Moreover, net die may be reduced when the semiconductor chip, herein, the master chip 110, is fabricated.

SUMMARY OF THE INVENTION

An embodiment of the present invention is directed to a semiconductor integrated circuit with the optimized number of through chip vias for improvement in terms of area.

In accordance with an embodiment of the present invention, a semiconductor integrated circuit, which includes: a semiconductor chip including a multiplexer for multiplexing first signals into an output signal in response to an operation mode signal and outputting the output signal; and a common through chip via configured to vertically penetrate through the semiconductor chip and interface transfer of the output signal.

In accordance with another embodiment of the present invention, a semiconductor integrated circuit, which includes: a first semiconductor chip including a first output circuit which is enabled in a first operation mode and outputs a first output signal and a second output circuit which is enabled in a second operation mode and outputs a second output signal; a second semiconductor chip including a first input circuit which is enabled in the first operation mode and receives the first output signal and a second input circuit which is enabled in the second operation mode and receives the second output signal; and a common through chip via arranged to vertically penetrate through the semiconductor chip, be coupled with the first and second output circuits in one end and coupled with the first and second input circuits in the other end, and interface transfer of the first and second output signals which are enabled in different operation modes, which include the first operation mode and the second operation mode.

DESCRIPTION OF SPECIFIC EMBODIMENTS

Figure 1:
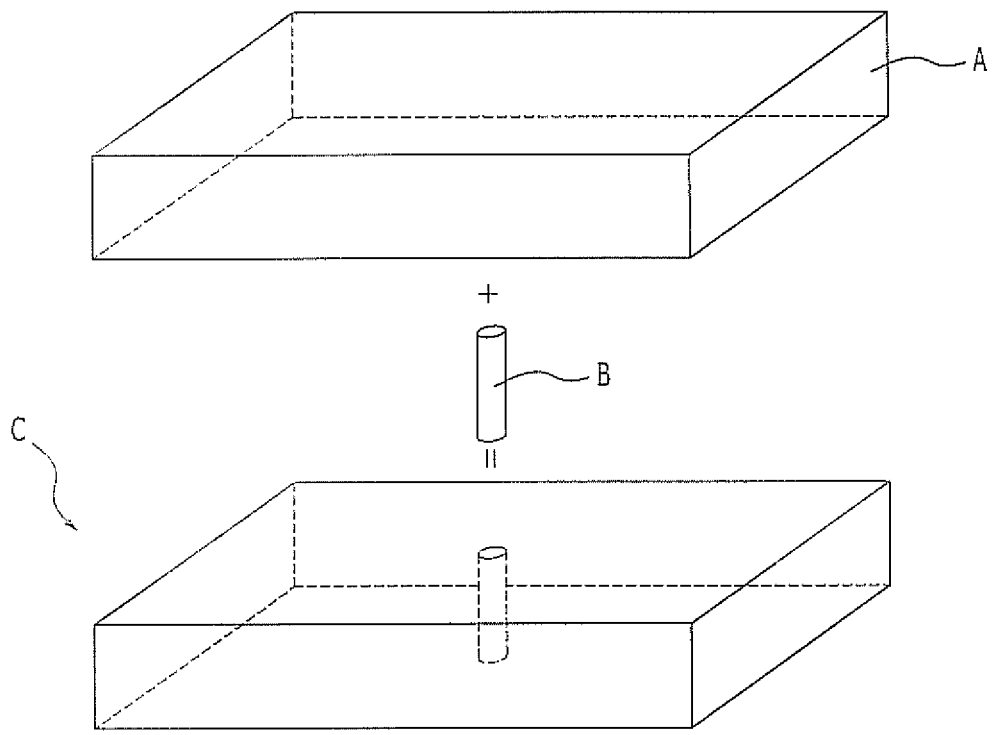
FIG. 1 illustrates a typical through chip via.
Figure 2:
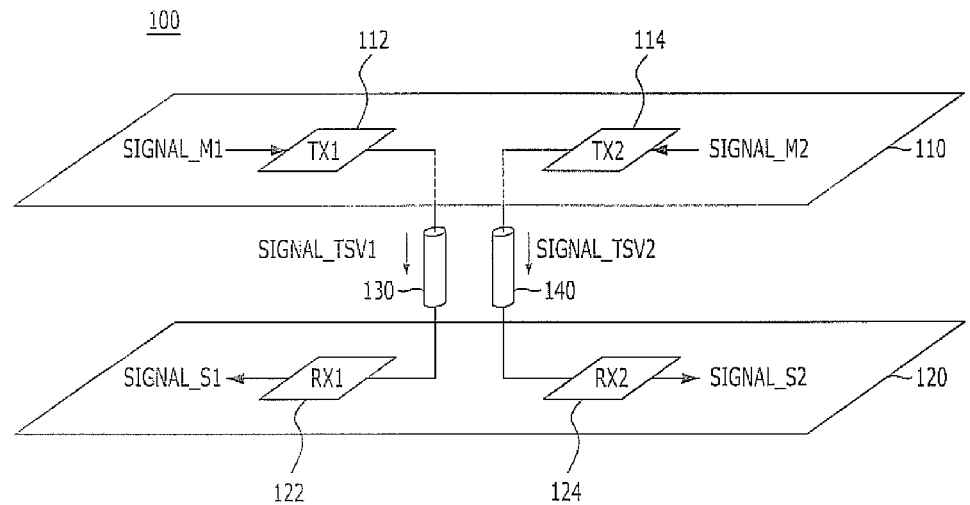
FIG. 2 illustrates a conceptual diagram of a typical semiconductor integrated circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
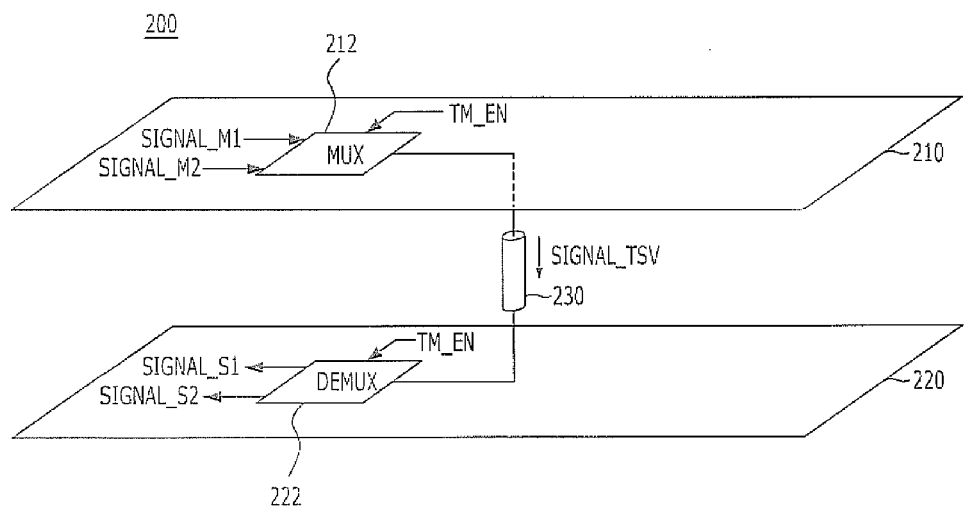
FIG. 3 is a conceptual diagram of a semiconductor integrated circuit in accordance with an embodiment of the present invention.

FIG. 3 is a conceptual diagram of a semiconductor integrated circuit in accordance with an embodiment of the present invention.

For illustration purposes, a semiconductor integrated circuit that includes two semiconductor chips and one common through chip via is described. However, the number of the semiconductor chips and through chip vias may vary.

Referring to FIG. 3, the semiconductor integrated circuit 200 includes a master chip 210, a slave chip 220, and a common through chip via 230. The master chip 210 includes a multiplexer 212 for multiplexing internal output signals SIGNAL_M1 and SIGNAL_M2, which are enabled in a test mode and a normal mode, respectively, into an output signal SIGNAL_TSV in response to a test mode signal TM_EN and outputting the output signal SIGNAL_TSV. The slave chip 220 includes a demultiplexer 222 for receiving the output signal SIGNAL_TSV from the master chip 210, demultiplexing the output signal SIGNAL_TSV, and outputting the internal output signals SIGNAL_M1 and SIGNAL_M2. The common through chip via 230 transfers the output signal SIGNAL_TSV of the master chip 210 to the slave chip 220.

The master chip 210 is a semiconductor chip which buffers an external signal (not shown) applied from the outside, e.g., a controller, and controls the slave chip 220 through the common through chip via 230. Generally, the master chip 210 is stacked over the slave chip 220. The multiplexer 212 is provided on the upper surface of the master chip 210, and the multiplexer 212 multiplexes signals for controlling the slave chip 220 (for example, the internal output signals SIGNAL_M1 and SIGNAL_M2 generated in an internal circuit (not shown) of the master chip 210) into the output signal SIGNAL_TSV, and outputs the output signal SIGNAL_TSV through the common through chip via 230. Since the internal output signals SIGNAL_M1 and SIGNAL_M2 enabled at different times may be transferred through one common through chip via 230, the total number of through chip vias is decreased.

The slave chip 220 is a semiconductor chip operating under the control of the master chip 210. The slave chip 220 receives the output signal SIGNAL_TSV transferred through the common through chip via 230 and performs a corresponding operation. The demultiplexer 222 is provided on the upper surface of the slave chip 220, and the demultiplexer 222 demultiplexer the output signal SIGNAL_TSV transferred through the common through chip via 230 into the internal output signals SIGNAL_M1 and SIGNAL_M2, and outputs the internal output signals SIGNAL_M1 and SIGNAL_M2 to an internal circuit (not shown) of the slave chip 220.

While details of the common through chip via 230 are not shown in the drawings, it vertically penetrates through the master chip 210 and one end of the common through chip via 230 is coupled with an output terminal of the multiplexer 212 and the other end of the common through chip via 230 is coupled with an input terminal of the demultiplexer 222. The common through chip via 230 may be a through silicon via (TSV).

Although not illustrated in the drawings, a bump pad for substantially coupling the common through chip via 230 with the slave chip 220 is provided between the common through chip via 230 and the slave chip 220. According to an embodiment, two common through chip vias 230 exist between the master chip 210 and the slave chip 220, where each common through chip via 230 has a respective multiplexer 212 and a respective demultiplexer 222.

Figure 4:
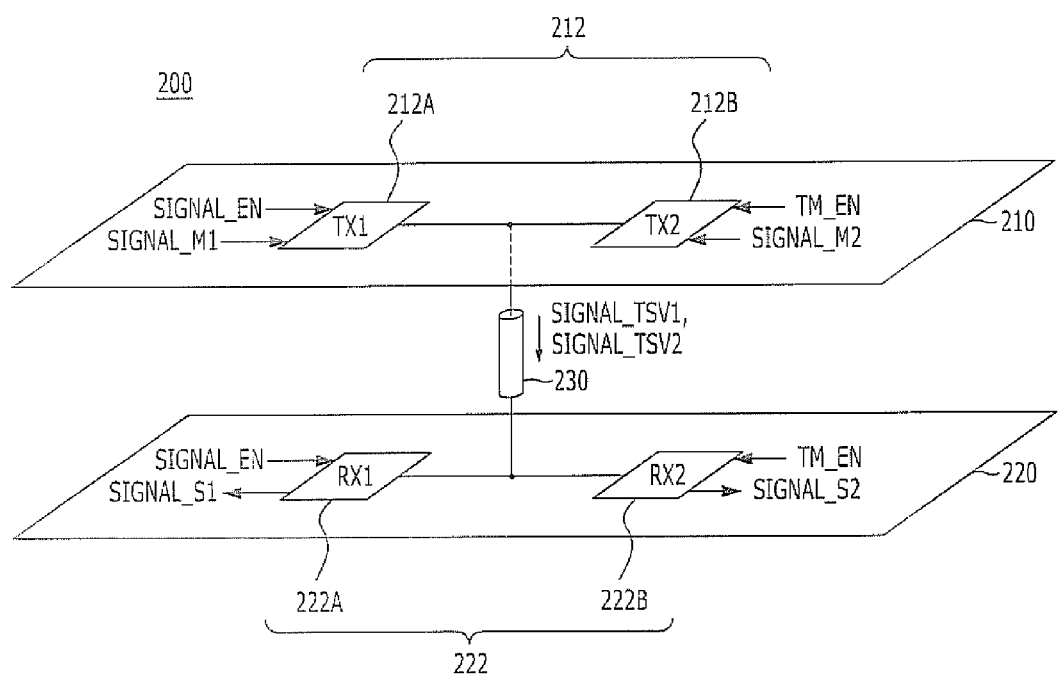
FIG. 4 is a schematic diagram illustrating the semiconductor integrated circuit shown in FIG. 3 in detail.

FIG. 4 is a schematic diagram illustrating the semiconductor integrated circuit 200 shown in FIG. 3 in detail.

Referring to FIG. 4, as mentioned before with reference to FIG. 3, the semiconductor integrated circuit 200 includes the master chip 210 provided with the multiplexer 212, the slave chip 220 provided with the demultiplexer 222, and the common through chip via 230 which is electrically connected to the master chip 210 and the slave chip 220.

The multiplexer 212 includes a first output circuit 212A which is enabled in a normal mode and a second output circuit 212B which is enabled in a test mode. The first output circuit 212A transforms the first internal output signal SIGNAL_M1 inputted from the internal circuit (not shown) of the master chip 210 into a first output signal SIGNAL_TSV1 and outputs the first output signal SIGNAL_TSV1 to the common through chip via 230. The second output circuit 212B transforms the second internal output signal SIGNAL_M2 inputted from the internal circuit (not shown) of the master chip 210 into a second output signal SIGNAL_TSV2 and outputs the second output signal SIGNAL_TSV2 to the common through chip via 230.

The demultiplexer 222 includes a first input circuit 222A which is enabled in the normal mode and a second input circuit 222B which is enabled in the test mode. The first input circuit 222A transforms the first output signal SIGNAL_TSV1 transferred through the common through chip via 230 into a first internal input signal SIGNAL_S1 and outputs the first internal input signal SIGNAL_S1 to the internal circuit (not shown) of the slave chip 220. The second input circuit 222B transforms the second output signal SIGNAL_TSV2 transferred through the common through chip via 230 into a second internal input signal SIGNAL_S2 and outputs the second internal input signal SIGNAL_S2 to the internal circuit (not shown) of the slave chip 220.

Figure 5A:
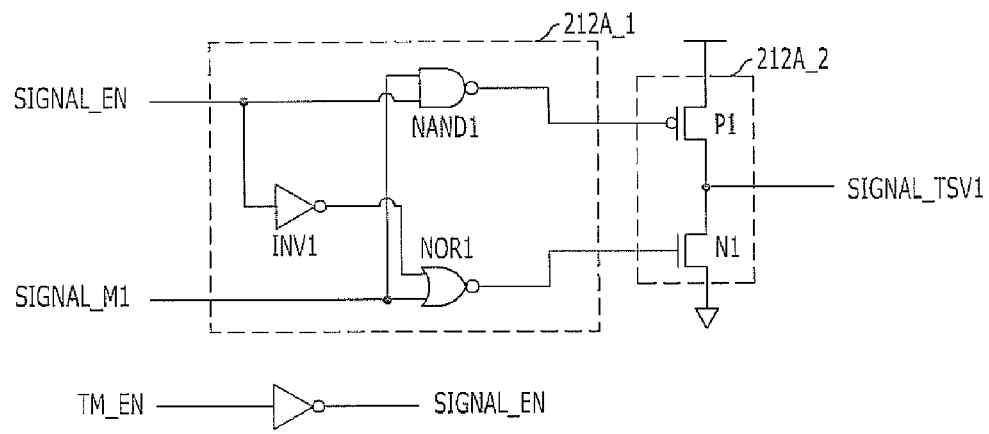
FIG. 5A is an internal circuit diagram exemplarily illustrating a first output circuit of FIG. 4.
Figure 5B:
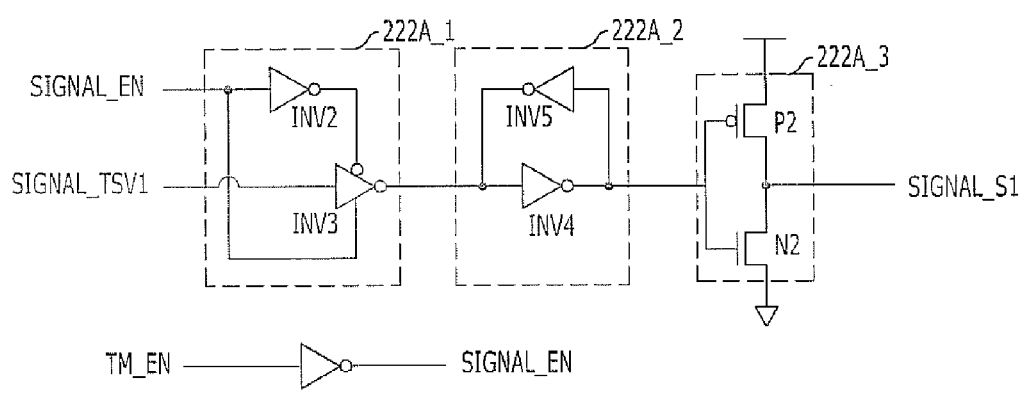
FIG. 5B is an internal circuit diagram exemplarily illustrating a first input circuit of FIG. 4.

FIG. 5A is an internal circuit diagram exemplarily illustrating the first output circuit 212A of FIG. 4. FIG. 5B is an internal circuit diagram exemplarily illustrating the first input circuit 222A of FIG. 4.

Referring to FIG. 5A, the first output circuit 212A includes a first transferring unit 212A_1 and a driving unit 212A_2. The first transferring unit 212A_1 selectively transfers the first internal output signal SIGNAL_M1 inputted from the internal circuit (not shown) of the master chip 210 in response to a normal mode signal SIGNAL_EN, which is an inverse signal of the test mode signal TM_EN. The driving unit 212A_2 drives the output terminal of the first output circuit 212A with a power source voltage based on the first internal output signal SIGNAL_M1 selectively transferred through the first transferring unit 212A_1 and outputs the first output signal SIGNAL_TSV1.

The first transferring unit 212A_1 includes a first NAND gate NAND1, a first inverter INV1, and a first NOR gate NOR1. The first NAND gate NAND1 receives the normal mode signal SIGNAL_EN and the first internal output signal SIGNAL_M1 and performs a NAND operation. The first inverter INV1 inverts the normal mode signal to SIGNAL_EN and outputs an inverse signal. The first NOR gate NOR1 receives the output signal of the first inverter INV1, which is the inverse signal, and the first internal output signal SIGNAL_M1 and performs a NAND operation. The driving unit 212A_2 includes a first PMOS transistor P1 and a first NMOS transistor N1. The first PMOS transistor P1 drives an output terminal of the first output circuit 212A with a high power source voltage in response to an output signal of the first NAND gate NAND1. The first NMOS transistor N1 drives the output terminal of the first output circuit 212A with a low power source voltage in response to an output signal of the first NOR gate NOR1. For example, the high power source voltage is denoted as 'VDD' while the low power source voltage is denoted as 'VSS.'

Referring to FIG. 5B, the first input circuit 222A includes a second transferring unit 222A_1, a first latch 222A_2, and a second driving unit 222A_3. The second transferring unit 222A_1 selectively transfers the first output signal SIGNAL_TSV1, which is transferred through the common through chip via 230, to the first latch 222A_2 in response to the normal mode signal SIGNAL_EN, which is an inverse signal of the test mode signal TM_EN. The first latch 222A_2 latches the first output signal SIGNAL_TSV1 which is selectively transferred from the second transferring unit 222A_1. The second driving unit 222A_3 drives the output terminal of the first input circuit 222A with a power source voltage based on an output signal of the first latch 222A_2 and outputs the first internal input signal SIGNAL_S1. The second transferring unit 222A_1 includes a second inverter INV2 for inverting the normal mode signal SIGNAL_EN and outputs an inverse signal, and a third inverter INV3 for selectively outputting the first output signal SIGNAL_TSV1 in response to the output signal of the second inverter INV2 and the normal mode signal SIGNAL_EN. The first latch 222A_2 includes a fourth inverter INV3 for inverting the output signal of the third inverter INV3 and outputting an inverse signal, and a fifth inverter INV5 for inverting the output signal of the fourth inverter INV4 and outputs an inverse signal to an input terminal of the fourth inverter INV4. The second driving unit 222A_3 includes a second PMOS transistor P2 and a second NMOS transistor N2. The second PMOS transistor P2 drives an output terminal of the first input circuit 222A with a high power source voltage in response to an output signal of the fourth inverter INV4. The second NMOS transistor N2 drives the output terminal of the first input circuit 212A with a low power source voltage in response to an output signal of the fourth inverter INV4.

Here, the second output circuit 212B and the second input circuit 222B may be realized the same as the first output circuit 212A and the first input circuit 222A, and thus, any redundant description thereof is omitted. The second output circuit 212B receives the test mode signal TM_EN and the second internal output signal SIGNAL_M2 instead of the normal mode signal SIGNAL_EN and the first internal output signal SIGNAL_M1, respectively, and outputs the second output signal SIGNAL_TSV2 instead of the first output signal SIGNAL_TSV1. The second input circuit 222B receives the test mode signal TM_EN and the second output signal SIGNAL_TSV2 instead of the normal mode signal SIGNAL_EN and the first output signal SIGNAL_TSV1, respectively, and outputs the second internal input signal SIGNAL_S2 instead of the first internal input signal SIGNAL_S1.

Hereafter, the operation of the semiconductor integrated circuit 200 is described in accordance with an embodiment of the present invention.

In the normal mode, the normal mode signal SIGNAL_EN is enabled to a logic high level, and the test mode signal TM_EN is disabled to a logic low level. Therefore, the first output circuit 212A and the first input circuit 222A are enabled and the second output circuit 212B and the second input circuit 222B are disabled.

In this state, when the first internal output signal SIGNAL_M1 is generated in the internal circuit (not shown) of the master chip 210, the first output circuit 212A transforms the first internal output signal SIGNAL_M1 into the first output signal SIGNAL_TSV1 and outputs the first output signal SIGNAL_TSV1 to the common through chip via 230. Here, the first transferring unit 212A_1 transfers the first internal output signal SIGNAL_M1 to the driving unit 212A_2 in response to the enabled normal mode signal SIGNAL_EN. Upon receipt of the first internal output signal SIGNAL_M1, the driving unit 212A_2 drives the output terminal of the first output circuit 212A with a power source voltage and outputs the first output signal SIGNAL_TSV1 to the common through chip via 230. Here, the driving unit 212A_2 may drive the output terminal with a sufficiently high driving force in consideration of the load on the common through chip via 230.

The first output signal SIGNAL_TSV1 passes through the common through chip via 230 and is transferred to the slave chip 220.

The first output signal SIGNAL_TSV1 transferred to the slave chip 220 is inputted into the first input circuit 222A which is enabled in the normal mode. Accordingly, the first input circuit 222A transforms the first output signal SIGNAL_TSV1 into the first internal input signal SIGNAL_S1 and outputs the first internal input signal SIGNAL_S1 to the internal circuit (not shown) of the slave chip 220. More specifically, the second transferring unit 222A_1 transfers the first output signal SIGNAL_TSV1 to the first latch 222A_2 in response to the enabled normal mode signal SIGNAL_EN. The first latch 222A_2 inverts the first output signal SIGNAL_TSV1 and outputs an inverse signal to the second driving unit 222A_3. The second driving unit 222A_3 receives the output signal of the and drives the output terminal of the first input circuit 222A with a power source voltage and outputs the first internal input signal SIGNAL_S1 to the internal circuit (not shown) of the slave chip 220.

Hereafter, an operation in the test mode is described.

In the test mode, the test mode signal TM_EN is enabled to a logic high level, and the normal mode signal SIGNAL_EN is disabled to a logic low level. Therefore, the second output circuit 212B and the second input circuit 222B are enabled and the first output circuit 212A and the first input circuit 222A are disabled.

In this state, when the second internal output signal SIGNAL_M2 is generated in the internal circuit (not shown) of the master chip 210, the second output circuit 212B transforms the second internal output signal SIGNAL_M2 into the second output signal SIGNAL_TSV2 and outputs the second output signal SIGNAL_TSV2 to the common through chip via 230. The remaining operation of the second output circuit 212B is the same as that of the first output circuit 212A, and thus, further description thereof is omitted.

The second output signal SIGNAL_TSV2 passes through the common through chip via 230 and is transferred to the slave chip 220.

The second output signal SIGNAL_TSV2 transferred to the slave chip 220 is inputted to the second input circuit 222B which is enabled in the test mode. Accordingly, the second input circuit 222B transforms the second output signal SIGNAL_TSV2 into the second internal input signal SIGNAL_S2 and outputs the second internal input signal SIGNAL_S2 to the internal circuit (not shown) of the slave chip 220. The remaining operation of the second input circuit 222B is the same as that of the first input circuit 222A, and thus, further description thereof is omitted.

According to an exemplary embodiment of the present invention, the number of through chip vias by transferring signals enabled at different times according to operation modes may be reduced by using a common through chip via for transferring the signals. Therefore, the overall area of a semiconductor integrated circuit may be reduced and net die may be increased.

While the present invention has been described with respect to the specific embodiments, it will be apparent to those skilled in the art that various changes and modifications may be made without departing from the spirit and scope of the invention as defined in the following claims.

While a master chip including an output circuit and a slave chip including an input circuit have been illustrated, the present invention is not limited thereto and may be applied in other cases including a case where the master chip includes an input circuit and the slave chip includes an output chip.

What is claimed is:

1. A semiconductor integrated circuit, comprising:
a semiconductor chip including a multiplexer for multiplexing first signals into an output signal in response to an operation mode signal and outputting the output signal, wherein the operation mode signal comprises a test mode signal and a normal mode signal; and
a first common through chip via configured to vertically penetrate through the semiconductor chip and interface transfer of the output signal,
wherein the multiplexer includes:
a first output circuit that receives the test mode signal and a first one of the first signals and outputs the first one of the first signals as the output signal in response to the test mode signal, and
a second output circuit that receives the normal mode signal and a second one of the first signals and outputs the second one of the first signals as the output signal in response to the normal mode signal.

2. The semiconductor integrated circuit of claim 1, further comprising a second common through chip via configured to vertically penetrate through the semiconductor chip and interface transfer of an input signal obtained by multiplexing second signals, wherein the semiconductor chip further comprises a demultiplexer configured to demultiplex the input signal in response to the operation mode signal.

3. The semiconductor integrated circuit of claim 2, wherein the first and second common through chip vias are through silicon vias (TSV).

4. The semiconductor integrated circuit of claim 1, wherein the test and normal mode signals are inverse signals of one another.

5. A semiconductor integrated circuit, comprising:
a first semiconductor chip including a first output circuit which is enabled in a first operation mode and outputs a first output signal and a second output circuit which is enabled in a second operation mode and outputs a second output signal;
a second semiconductor chip including a first input circuit which is enabled in the first operation mode and receives the first output signal and a second input circuit which is enabled in the second operation mode and receives the second output signal; and
a first common through chip via arranged to vertically penetrate through the first semiconductor chip, be coupled with the first and second output circuits in one end and coupled with the first and second input circuits in the other end, and interface transfer of the first and second output signals which are enabled in different operation modes, which include the first operation mode and the second operation mode,
wherein the first output circuit and the first input circuit are enabled in response to a test mode signal, and the second output circuit and the second input circuit are enabled in response to a normal mode signal.

6. The semiconductor integrated circuit of claim 5, wherein the first common through chip via is a through silicon via (TSV).

7. The semiconductor integrated circuit of claim 5, wherein the normal mode signal is an inverse signal of the test mode signal.

8. The semiconductor integrated circuit of claim 7, wherein the first output circuit comprises:

a first transferring unit for selectively transferring a first internal output signal, which is inputted from an internal circuit of the first semiconductor chip, in response to the test mode signal; and a first driving unit for driving an output terminal of the first output circuit with a power source voltage according to the first internal output signal, which is selectively transferred from the first transferring unit, and outputting the first output signal.

9. The semiconductor integrated circuit of claim 8, wherein the first input circuit comprises:

a second transferring unit for selectively transferring the first output signal, which is outputted from the first driving unit, in response to the test mode signal;

a first latch for latching the first output signal which is selectively transferred from the second transferring unit; and a second driving unit for driving an output terminal of the first input circuit with a power source voltage according to an output signal of the first latch and outputting the first internal input signal to an internal circuit of the second semiconductor chip.

10. The semiconductor integrated circuit of claim 7, wherein the second output circuit comprises:

a third transferring unit for selectively transferring a second internal output signal, which is inputted from the internal circuit of the first semiconductor chip, in response to the normal mode signal; and a third driving unit for driving an output terminal of the second output circuit according to the second internal output signal selectively transferred from the third transferring unit and outputting the second output signal.

11. The semiconductor integrated circuit of claim 10, wherein the second input circuit comprises:

a fourth transferring unit for selectively transferring the second output signal, which is outputted from the third driving unit, in response to the normal mode signal;

a second latch for latching the second output signal, which is selectively transferred from the fourth transferring unit; and a fourth driving unit for driving an output terminal of the second input circuit with a power source voltage according to an output signal of the second latch and outputting the second internal input signal to the internal circuit of the second semiconductor chip.

12. The semiconductor integrated circuit of claim 5, wherein the first semiconductor chip is stacked over the second semiconductor chip.

13. The semiconductor integrated circuit of claim 12, further comprising:

a bump pad configured to electrically connect the common through chip via to the second semiconductor chip.

14. The semiconductor integrated circuit of claim 5, wherein the second semiconductor chip further comprises a third output circuit which is enabled in the first operation mode and outputs a third output signal and a fourth output circuit which is enabled in the second operation mode and outputs a fourth output signal, and wherein the first semiconductor chip further comprises a third input circuit which is enabled in the first operation mode and receives the third output signal and a fourth input circuit which is enabled in the second operation mode and receives the fourth output signal, and wherein the semiconductor integrated circuit further comprises:

a second common through chip via arranged to vertically penetrate through the first semiconductor chip, be coupled with the third and fourth input circuits in one end and coupled with the third and fourth output circuits in the other end, and interface transfer of the third and fourth output signals which are enabled in different operation modes, which include the first operation mode and the second operation mode.

15. The semiconductor integrated circuit of claim 14, wherein the third output circuit and the third input circuit are enabled in response to the test mode signal, and the fourth output circuit and the fourth input circuit are enabled in response to the normal mode signal, which is an inverse signal of the test mode signal.

16. The semiconductor integrated circuit of claim 14, wherein the second common through chip via is a through silicon via (TSV).

* * * * *